US012203972B2

(12) United States Patent
Hou (10) Patent No.: US 12,203,972 B2
(45) Date of Patent: Jan. 21, 2025

(54) DISPLAY PANEL AND BURN-IN TEST METHOD OF THE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Jida Hou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/771,689

(22) PCT Filed: Apr. 22, 2022

(86) PCT No.: PCT/CN2022/088529
§ 371 (c)(1),
(2) Date: Apr. 25, 2022

(87) PCT Pub. No.: WO2023/197362
PCT Pub. Date: Oct. 19, 2023

(65) Prior Publication Data
US 2024/0168081 A1    May 23, 2024

(30) Foreign Application Priority Data

Apr. 11, 2022    (CN) .......................... 202210376262.2

(51) Int. Cl.
*G01R 31/26*    (2020.01)
*G01R 31/27*    (2006.01)

(52) U.S. Cl.
CPC ......... *G01R 31/2642* (2013.01); *G01R 31/27* (2013.01)

(58) Field of Classification Search
CPC .... G01R 31/2642; G01R 31/27; G01R 31/00; G09G 3/006; G09G 3/3208; G09G 3/3233
(Continued)

(56) References Cited

U.S. PATENT DOCUMENTS 10,147,356 B2 *   12/2018   Kuang ................. G09G 3/3258
2019/0156753 A1 *  5/2019   Yang .................... G09G 3/3266
(Continued)

FOREIGN PATENT DOCUMENTS

CN    102243839 A    11/2011
CN    106847187 A    6/2017
(Continued)

OTHER PUBLICATIONS

PCT International Search Report for International Application No. PCT/CN2022/088529, mailed on Dec. 15, 2022, 10pp.
(Continued)

*Primary Examiner* — Raul J Rios Russo
(74) *Attorney, Agent, or Firm* — The Roy Gross Law Firm, LLC; Roy Gross (57) ABSTRACT

A display panel and a burn-in test method of the display panel are disclosed. The display panel includes a data writing module, a driving module, a sensing module, a control module, and a light-emitting module. Different devices are set in each module. When the display panel is subjected to a burn-in test, a high level signal is provided to the control module, thereby controlling a test current to flow to the light-emitting module. Thereby, an influence of high current on a test performance is improved, and a comprehensive performance of the display panel is improved.

20 Claims, 5 Drawing Sheets

(58) Field of Classification Search
USPC .................................................. 324/750.05
See application file for complete search history.

(56) References Cited

U.S. PATENT DOCUMENTS

| | | | |
|---|---|---|---|
| 2022/0076614 A1* | 3/2022 | Li | G09G 3/32 |
| 2022/0262313 A1* | 8/2022 | Wang | G09G 3/3233 |
| 2022/0310016 A1* | 9/2022 | Yang | G09G 3/3266 |

FOREIGN PATENT DOCUMENTS

| | | |
|---|---|---|
| CN | 107039004 A | 8/2017 |
| CN | 107799069 A | 3/2018 |
| CN | 110634432 A | 12/2019 |
| CN | 113112956 A | 7/2021 |
| KR | 20090057855 A | 6/2009 |

OTHER PUBLICATIONS

PCT Written Opinion of the International Search Authority for International Application No. PCT/CN2022/088529, mailed on Dec. 15, 2022, 9pp.

* cited by examiner

Providing a burn-in test circuit, the burn-in test circuit includes a plurality of pixel driving circuits, and the pixel driving circuits have the circuit structure provided in the embodiment of the present invention — S100

Performing a burn-in test on corresponding light-emitting modules in different ones of the pixel driving circuits, wherein the high level signal is provided to a third control signal line in the one of the pixel driving circuit, the corresponding light-emitting modules in the different ones of the pixel driving circuits are aged, and when the high level signal is provided to the third control signal line, a low level signal is provided to the data signal line in one of the pixel driving circuit corresponding to a circuit without the burn-in test — S101

DISPLAY PANEL AND BURN-IN TEST METHOD OF THE DISPLAY PANEL

CROSS REFERENCE TO RELATED APPLICATIONS

This application is a National Phase of PCT Patent Application No. PCT/CN2022/088529 having International filing date of Apr. 22, 2022, which claims the benefit of priority of Chinese Patent Application No. 202210376262.2, filed Apr. 11, 2022, the contents of which are all incorporated herein by reference in their entirety.

FIELD OF THE DISCLOSURE

The present application relates to the field of display technologies of display panels, and more particularly, to a display panel and a burn-in test method of the display panel.

BACKGROUND

With the development of display technologies such as manufacturing processes of display panels, people have put forward higher requirements for performance and quality of display panels and devices.

After the preparation of the display panel is completed, various performances and parameters of the display panel need to be tested and optimized. In organic light-emitting diode (OLED) display devices, OLED has the characteristics of self-luminescence, thinness, low power consumption, and fast response speed, and is widely used in various display fields. When evaluating OLED devices, the lifetime of OLED devices is one of important indicators. Therefore, in the prior art, during the OLED preparation process, it is usually necessary to perform a lifetime-aging (L-Aging) process on the prepared OLED device. In the L-Aging process, a circuit design of a circuit structure, a test environment, and a current density of the test are main test factors. Specifically, in the existing pixel driving circuit, when the light-emitting device is subjected to a burn-in test, the organic light-emitting device often has brightness fluctuations in the early stage of lighting the device, or in the early stage of testing the organic light-emitting device, its brightness will drop rapidly. This further leads to display color shift of the display device and reduces a service life and quality of the device, which is not conducive to the improvement of the device performance.

Therefore, it is necessary to propose solutions to the issues in the prior art.

SUMMARY

Technical Problem

To sum up, in the prior art, when a display device is subjected to a burn-in test, a light-emitting device may have large brightness fluctuations in an initial stage of the burn-in test. This leads to a color shift in the display device and leads to issues such as the degradation of lifespan and quality of the device. It is not conducive to an improvement of a comprehensive performance of the display device.

Technical Solution

To solve the above issues, embodiments of the present invention provide a display panel and a burn-in test method of the display panel. This effectively improves that the display panel in the initial stage of the burn-in test, the light-emitting device is prone to large fluctuations, which in turn causes the display device to have issues such as color shift and quality degradation.

In order to solve the above-mentioned technical problems, the technical methods provided by the embodiments of the present invention are as follows:

In a first aspect of the embodiments of the present invention, a display panel is provided, the display panel comprises a burn-in test circuit, the burn-in test circuit comprises a plurality of pixel driving circuits, and one of the pixel driving circuits comprises:
 a data writing module, wherein the data writing module is electrically connected to a data signal line of the display panel and writes a data signal through the data signal line;
 a driving module, wherein the driving module is electrically connected to the data writing module, and the driving module is used to receive the data signal of the data writing module and form a driving voltage according to the data signal;
 a sensing module, wherein the sensing module is electrically connected to the driving module, and the sensing module is used to sense the driving voltage and form a feedback current according to the driving voltage;
 a control module, wherein the control module is electrically connected to the driving module and the sensing module; and
 a light-emitting module, wherein the light-emitting module is electrically connected to the driving module, the sensing module, and the control module;
 wherein the control module is used to receive a high level signal and perform a burn-in test on the light-emitting module according to the driving voltage and the feedback current, the driving module is provided with at least one thin film transistor and a capacitor, and the thin film transistor is electrically connected to the capacitor correspondingly.

According to an embodiment of the present invention, the driving module comprises a first thin film transistor, a drain of the first thin film transistor is electrically connected to a voltage terminal, a gate of the first thin film transistor is electrically connected to the data writing module, and a source of the first thin film transistor is electrically connected to the light-emitting module, the sensing module, and the control module.

According to an embodiment of the present invention, the driving module further comprises a capacitor, an end of the capacitor is electrically connected to the gate, and another end of the capacitor is electrically connected to the source.

According to an embodiment of the present invention, the data writing module comprises a second thin film transistor, a drain of the second thin film transistor is electrically connected to the data signal line, and a source of the second thin film transistor is electrically connected to the driving module.

According to an embodiment of the present invention, the pixel driving circuit further comprises a first control signal line, and the first control signal line is electrically connected to a gate of the second thin film transistor.

According to an embodiment of the present invention, the sensing module comprises a third thin film transistor, and a source of the third thin film transistor is electrically connected to the driving module, the light-emitting module, and the control module.

According to an embodiment of the present invention, the pixel driving circuit further comprises a second control signal line, and the second control signal line is electrically connected to a gate of the third thin film transistor.

In a second aspect of the embodiments of the present invention, a display panel is provided, the display panel comprises a burn-in test circuit, the burn-in test circuit comprises a plurality of pixel driving circuits, and one of the pixel driving circuits comprises:
   a data writing module, wherein the data writing module is electrically connected to a data signal line of the display panel and writes a data signal through the data signal line;
   a driving module, wherein the driving module is electrically connected to the data writing module, and the driving module is used to receive the data signal of the data writing module and form a driving voltage according to the data signal;
   a sensing module, wherein the sensing module is electrically connected to the driving module, and the sensing module is used to sense the driving voltage and form a feedback current according to the driving voltage;
   a control module, wherein the control module is electrically connected to the driving module and the sensing module; and
   a light-emitting module, wherein the light-emitting module is electrically connected to the driving module, the sensing module, and the control module;
   wherein the control module is used to receive a high level signal and perform a burn-in test on the light-emitting module according to the driving voltage and the feedback current.

According to an embodiment of the present invention, the driving module comprises a first thin film transistor, a drain of the first thin film transistor is electrically connected to a voltage terminal, a gate of the first thin film transistor is electrically connected to the data writing module, and a source of the first thin film transistor is electrically connected to the light-emitting module, the sensing module, and the control module.

According to an embodiment of the present invention, the driving module further comprises a capacitor, an end of the capacitor is electrically connected to the gate, and another end of the capacitor is electrically connected to the source.

According to an embodiment of the present invention, the data writing module comprises a second thin film transistor, a drain of the second thin film transistor is electrically connected to the data signal line, and a source of the second thin film transistor is electrically connected to the driving module.

According to an embodiment of the present invention, the pixel driving circuit further comprises a first control signal line, and the first control signal line is electrically connected to a gate of the second thin film transistor.

According to an embodiment of the present invention, the sensing module comprises a third thin film transistor, and a source of the third thin film transistor is electrically connected to the driving module, the light-emitting module, and the control module.

According to an embodiment of the present invention, the pixel driving circuit further comprises a second control signal line, and the second control signal line is electrically connected to a gate of the third thin film transistor.

According to an embodiment of the present invention, the control module comprises a fourth thin film transistor, a drain of the fourth thin film transistor is electrically connected to the data signal line, and a source of the fourth thin film transistor is electrically connected to the light-emitting module, the driving module, and the sensing module.

According to an embodiment of the present invention, the pixel driving circuit further comprises a third control signal line, and a gate of the fourth thin film transistor is electrically connected to the third control signal line.

According to an embodiment of the present invention, the third control signal line is used to provide the high level signal to the gate of the fourth thin film transistor.

According to an embodiment of the present invention, the pixel driving circuit comprises a first pixel driving circuit, a second pixel driving circuit, and a third pixel driving circuit, the first pixel driving circuit, the second pixel driving circuit, and the third pixel driving circuit are correspondingly arranged in light-emitting pixel areas of different colors, and the sensing module in the first pixel driving circuit is electrically connected to the sensing module in the second pixel driving circuit and the sensing module in the third pixel driving circuit.

According to an embodiment of the present invention, drains of corresponding third thin film transistors in each pixel driving circuit are electrically connected to each other.

In a third aspect of the embodiments of the present invention, a burn-in test method of a display panel is further provided, the burn-in test method of the display panel comprises following steps:
   providing a burn-in test circuit, the burn-in test circuit includes a plurality of pixel driving circuits, and the pixel driving circuits have the circuit structure provided in the embodiment of the present invention;
   performing a burn-in test on corresponding light-emitting modules in different ones of the pixel driving circuits, wherein the high level signal is provided to a third control signal line in the one of the pixel driving circuit, the corresponding light-emitting modules in the different ones of the pixel driving circuits are aged, and when the high level signal is provided to the third control signal line, a low level signal is provided to the data signal line in one of the pixel driving circuit corresponding to a circuit without the burn-in test.

Advantageous Effect

To sum up, the advantageous effects of the embodiments of the present invention are as follows:

Embodiments of the present invention provide a display panel and a burn-in test method of the display panel. A burn-in test circuit includes a plurality of pixel driving circuits. The pixel driving circuit includes a data writing module, a driving module, a sensing module, a control module, and a light-emitting module. The modules are connected to each other correspondingly. Thin film transistors with different functions are arranged in the corresponding modules. When the burn-in test is performed on the light-emitting module in the display panel, a high level signal is provided to the control module, thereby controlling a test current to flow to the light-emitting module. Further, the influence of factors such as current in the circuit on the burn-in test effect of the device is reduced, thereby effectively improving the burn-in test effect of the display panel and improving the comprehensive performance of the display panel.

DETAILED DESCRIPTION

The following descriptions of the various embodiments refer to the accompanying drawings to illustrate specific embodiments in which the present disclosure may be practiced.

With the continuous development of display panel manufacturing technology, people have put forward higher requirements for quality and display performance of the display panel.

Figure 1:
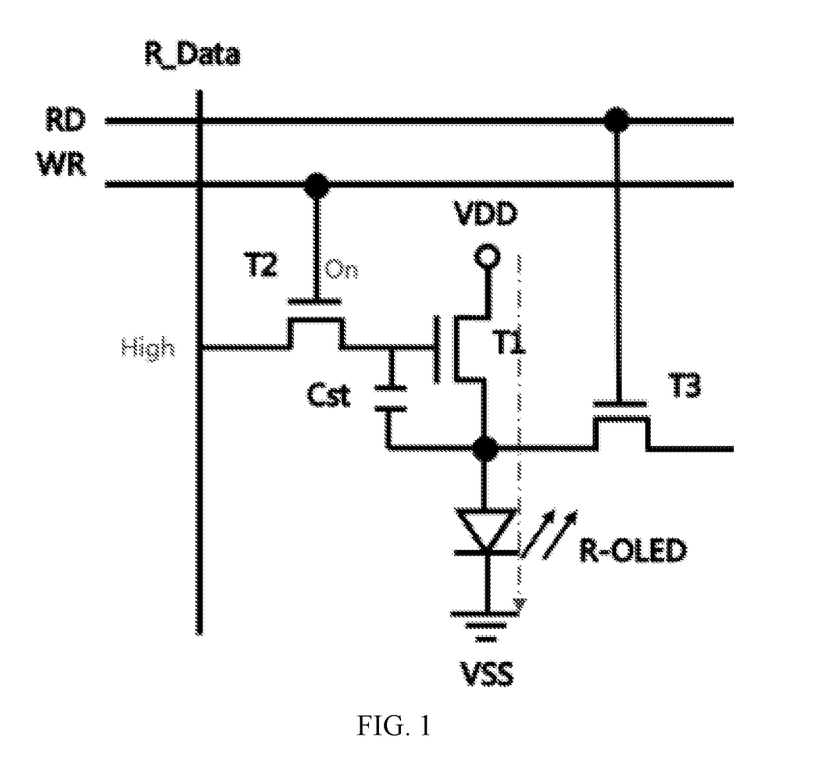
FIG. 1 takes a circuit corresponding to a red light-emitting pixel area as an example for description.

As shown in FIG. 1, FIG. 1 is a schematic structural diagram of a corresponding pixel driving circuit in a display panel provided in the prior art. After the display panel is fabricated, a light-emitting device needs to be subjected to a burn-in test to improve a service life and a display performance of the light-emitting device.

When a pixel driving circuit is in operation, as shown in FIG. 1, a circuit corresponding to a red light-emitting pixel area is used as an example for description. The existing 3T1C pixel driving circuit includes a first thin film transistor T1, a second thin film transistor T2, a third thin film transistor T3, and a capacitor Cst. When an OLED is displayed, a WR signal line controls the conduction of the second thin film transistor T2, a data signal line R Data enters a gate of T1 and the capacitor Cst through T2, and then T2 is turned off. Due to a storage function of the capacitor Cst, a gate voltage of T1 can still maintain the data signal voltage. Thus, T1 is turned on, and the driving current enters the organic light-emitting diode OLED through T1. In addition, a threshold voltage Vth of T1 in the driving circuit is sensed through T3 to compensate the threshold voltage Vth.

However, in the prior art, when the above-mentioned OLED is subjected to a burn-in test and compensation, it can only compensate for the threshold voltage Vth of the driving thin film transistor but cannot compensate for the performance of OLED aging on brightness. When the OLED ages, a test temperature is high and a test current is large, and its K value will drift, which further leads to a decrease in brightness and luminous efficiency of the display panel.

Embodiments of the present invention provide a display panel and a burn-in test method of the display panel to effectively improve that during the burn-in test of the display panel, under the action of high test temperature and high current, the thin film transistors inside the pixel driving circuit are prone to electrical drift, and the light-emitting devices are prone to large brightness fluctuations. The overall performance of the display panel is improved.

Figure 2:
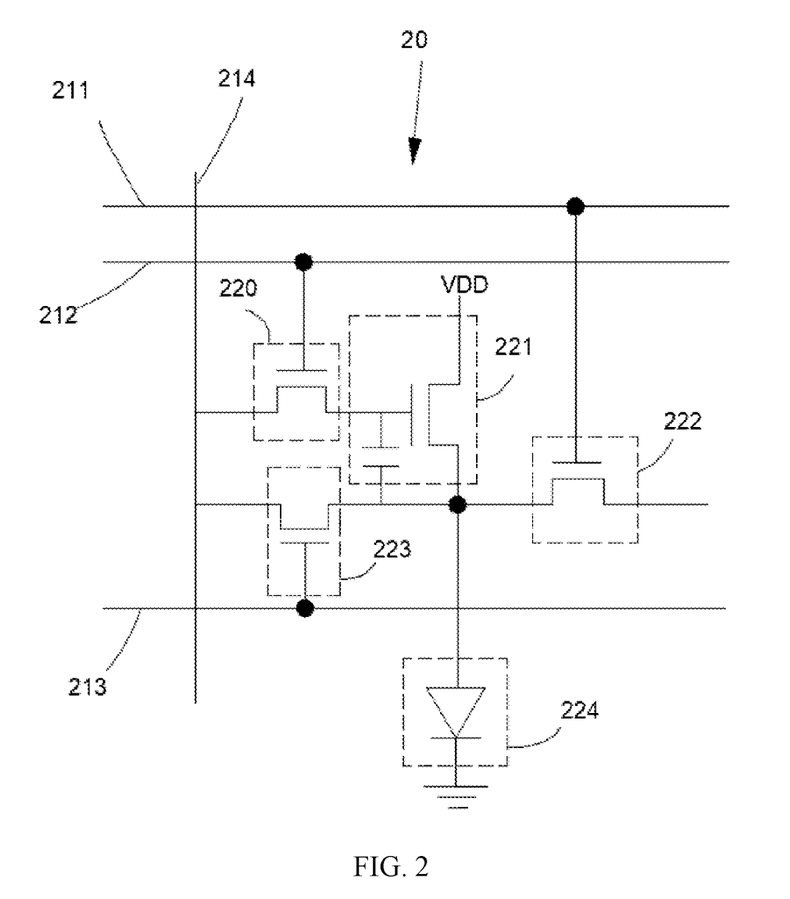
FIG. 2 is a schematic structural diagram of a burn-in test circuit in a display panel according to an embodiment of the present invention.

As shown in FIG. 2, FIG. 2 is a schematic structural diagram of a burn-in test circuit in a display panel according to an embodiment of the present invention. In the embodiment of the present invention, the display panel includes a burn-in test circuit. The burn-in test circuit includes a plurality of pixel driving circuits. The plurality of pixel driving circuits may correspond to different light-emitting pixels, for example, corresponding to red light-emitting pixels, blue light-emitting pixels, and green light-emitting pixels, respectively. In the embodiment of the present invention, a pixel driving circuit corresponding to a red light-emitting pixel is used as an example for description.

In the embodiment of the present invention, the pixel driving circuit 20 includes a data writing module 220, a driving module 221, a sensing module 222, a control module 223, and a light-emitting module 224. In the pixel driving circuit 20, data signal lines and scan signal lines are alternately distributed to form corresponding light-emitting units. Specifically, the data writing module 220 is electrically connected to the data signal line and the scan signal line and writes the data signal through the data signal line of the display panel.

The data writing module 220 is electrically connected to the driving module 221. The driving module 221 is used to receive the data signal from the data writing module 220 and form a driving current according to the data signal. In addition, one end of the driving module 221 is also connected to the driving voltage VDD, and the driving voltage VDD provides it with a working voltage.

Further, the sensing module 222 is electrically connected to the driving module 221. The sensing module 222 is used to sense the driving current or voltage in the driving module 22 and form a feedback current to the driving module according to the sensed data to compensate the driving module. For example, the threshold voltage or current of the driving module 221 is sensed, and the threshold voltage or current is compensated to ensure a normal light emission of the display panel.

The control module 223 is electrically connected to the driving module 221 and the sensing module 222. The control module 223 performs a burn-in test on the light-emitting device according to the driving voltage in the driving module and the feedback current in the sensing module 222.

Further, the pixel driving circuit further includes a light-emitting module 224. One end of the light-emitting module is electrically connected to the driving module 221, the sensing module 222, and the control module 223. Under the action of the above modules, the light-emitting module emits light normally and performs a burn-in test.

In the embodiment of the present invention, the pixel driving circuit further includes a first control signal line 211, a second control signal line 212, a third control signal line 213, and a data signal line 214. Specifically, the first control signal line 211 may be a read data signal line. The first control signal line 211 is electrically connected to one end of the sensing module 222 to transmit a control signal to the sensing module 222.

The second control signal line 212 may be a scan signal line. The second control signal line 212 is electrically connected to one end of the data writing module 220, and a scan signal is provided to the data writing module 220 through the second control signal line 212.

The third control signal line 213 is electrically connected to one end of the control module 223. The third control signal line 213 is used to provide a control signal to the control module 223 and ensure the burn-in test of the light-emitting module 224.

In the embodiment of the present invention, the data signal line 214 is electrically connected to the data writing module 220 and the control module 223. When the light-emitting module 224 is subjected to the burn-in test, a high level signal is provided to the third control signal line 213. The high level signal drives the control module 223 to work and forms a burn-in current. In addition, the control module performs a burn-in test on the light-emitting module according to the driving voltage in the driving module and the feedback current in the sensing module.

Figure 3:
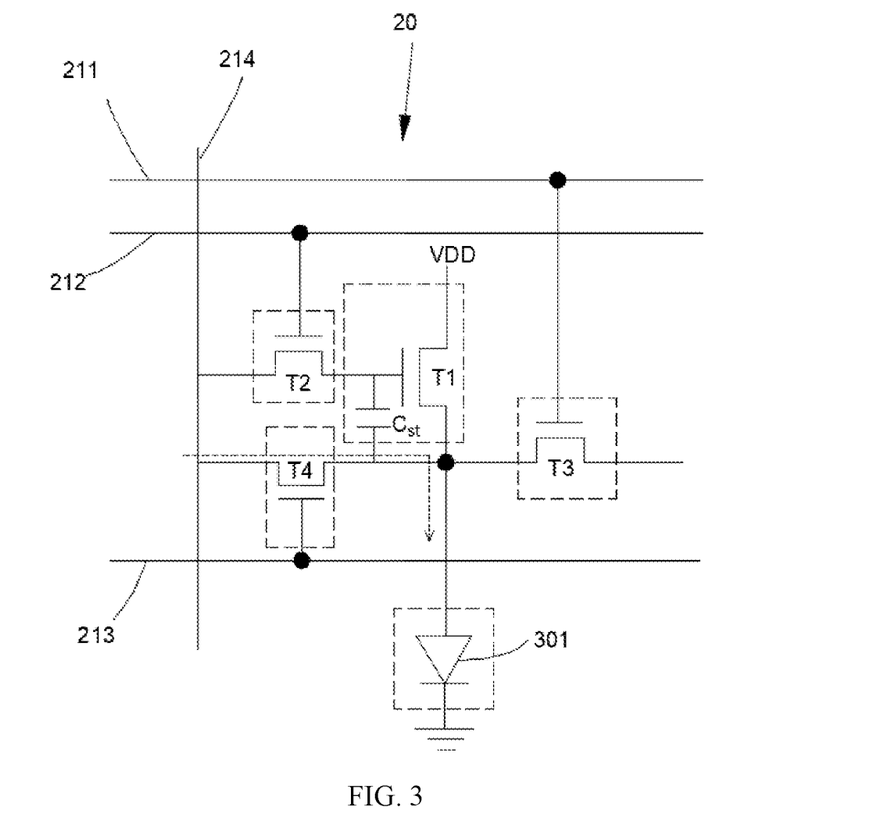
FIG. 3 is a schematic diagram of a circuit structure corresponding to another burn-in test circuit provided in an embodiment of the present invention.

As shown in FIG. 3, FIG. 3 is a schematic diagram of a circuit structure corresponding to another burn-in test circuit provided in an embodiment of the present invention. With reference to the circuit structure in FIG. 2, in this embodiment of the present invention, at least one thin film transistor may be included in each of the foregoing modules. Specifically, the driving module 221 includes a first thin film transistor T1 and a capacitor Cst. The data writing module 220 includes a second thin film transistor T2, the sensing module 222 includes a third thin film transistor T3, and the control module 223 includes a fourth thin film transistor T4.

Specifically, in the embodiment of the present invention, a gate of the second thin film transistor T2 is electrically connected to the second control signal line 212. A drain of the second thin film transistor T2 is electrically connected to the data signal line 214. A source of the second thin film transistor T2 is electrically connected to one end of the capacitor Cst and the gate of the first thin film transistor T1.

Further, the drain of the first thin film transistor T1 is electrically connected to a VDD voltage terminal, and the gate of the first thin film transistor T1 is electrically connected to one end of the capacitor Cst. The other end of the capacitor Cst is electrically connected to the source of the first thin film transistor T1, and the source of the first thin film transistor T1 is electrically connected to a source of the third thin film transistor T3.

A gate of the third thin film transistor T3 is electrically connected to the first control signal line 211. The source of the third thin film transistor T3 is electrically connected to the source of the first thin film transistor T1, the other end of the capacitor Cst, a source of the fourth thin film transistor T4, and one end of the light-emitting diode 301. A drain of the third thin film transistor T3 is electrically connected to the corresponding thin film transistor in another pixel driving circuit.

Further, the gate of the fourth thin film transistor T4 is electrically connected to the third control signal line 213, and the drain of the fourth thin film transistor T4 is electrically connected to the data signal line 214. The source of the fourth thin film transistor T4 is electrically connected to the other end of the capacitor Cst, the source of the first thin film transistor T1, the source of the third thin film transistor T3, and one end of the light-emitting diode 301.

In the embodiment of the present invention, when the light-emitting diode is subjected to the burn-in test, in the L-Aging stage, when the red pixel driving circuit corresponding to the light-emitting diode needs to be subjected to the burn-in process, the third control signal line 213 provides a high potential, The fourth thin film transistor T4 is fully turned on. The operating current and voltage corresponding to the fourth thin film transistor T4 are in a linear region, and the fourth thin film transistor T4 is equivalent to a resistor. When the data signal line 214 further provides the data signal to the fourth thin film transistor, the current in the pixel driving circuit can flow in the direction marked by the dotted line in FIG. 3. Thus, the light-emitting diode 301 in the red light-emitting pixel area is driven to emit light and the L-Aging process is completed.

Figure 4:
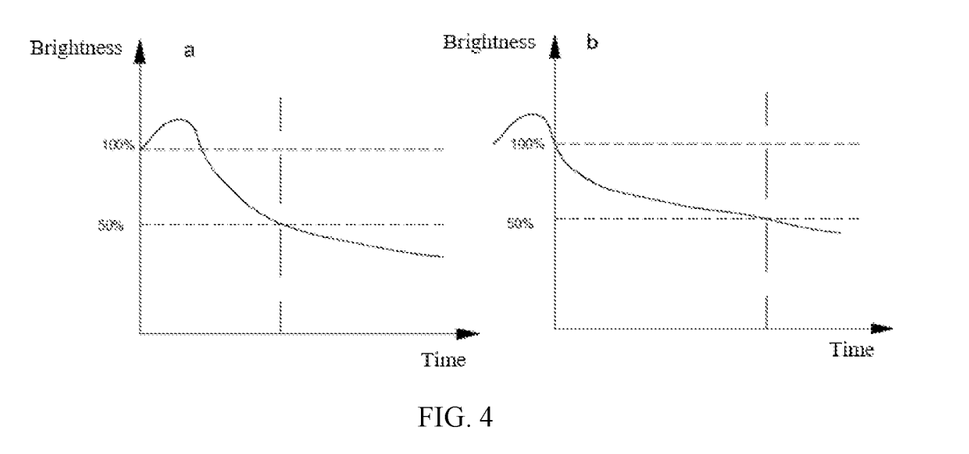
FIG. 4 is a schematic diagram of curves corresponding to a burn-in process of light-emitting diodes in different pixel driving circuits.

As shown in FIG. 4, FIG. 4 is a schematic diagram of burn-in curves corresponding to light emitting diodes in different pixel driving circuits during burn-in processing. It can be seen from the schematic diagram of the curve that during the burn-in test of the light-emitting diode, its brightness will fluctuate to a certain degree in the initial stage of lighting, and if it reaches a certain brightness, it will drop rapidly. As a result, the color shift of the display panel and the shortening of its lifespan are caused.

In FIG. 4, figure a is a schematic diagram of a corresponding burn-in curve under the structure of a pixel driving circuit in the prior art. Figure b corresponds to a schematic diagram of a burn-in curve corresponding to the pixel driving circuit structure provided in the embodiment of the present invention. When using the burn-in test circuit provided in the embodiment of the present invention, at time T=0, the burn-in curve will shift to the left when the organic light-emitting device is initially turned on. Then, the initial instability is eliminated to reduce the color shift issue caused by the initial instability. And it can be known that when the brightness of the curve is reduced to 50%, the burn-in curves in the embodiments of the present invention can all be located in the linear region. Therefore, in the burn-in process, under the action of a large current of the pixel driving circuit, the thin film transistors inside the circuit are prone to electrical drift, and the display panel is prone to color shift issues.

Further, with reference to FIG. 2 to FIG. 4, in the embodiment of the present invention, when a burn-in test is performed on the light-emitting device in the display panel, in the L-Aging stage, for example, when the red sub-pixel of the light-emitting diode is subjected to an entire surface during the L-Aging process, the third control signal line is given a high potential, so that the fourth thin film transistor T4 corresponding to the red sub-pixel is fully turned on. Under the action of the burn-in circuit, the fourth thin film transistor T4 can work in the linear region, which can be equivalent to a resistor. The data signal line then sends the corresponding electrical signal, and then drives the red light-emitting diode to emit light and completes the burn-in test.

Specifically, when the fourth thin film transistor T4 operates in the linear working region, according to the $I_{ds}$ curve of its output characteristic, $I_{ds}=\mu \cdot C_{ox} \cdot W \cdot (V_{gs}-V_{th}) \cdot V_{ds}/L$, where $V_{ds} << (V_{gs}-V_{th})$, μ is a migration speed of electrons, $C_{ox}$ is a gate oxide capacitance per unit area, W/L is an oxide width-length ratio, and $V_{gs}-V_{th}$ is an overdrive voltage.

During the burn-in process, the third control signal line provides a high level signal. The preferred high level signal is 15V. When the voltage value of the high level signal is 15V, the Vg voltage corresponding to the fourth thin film transistor T4 is very large. That is, Vgs−Vth>>Vds, which satisfies the condition that the thin film transistor works in the linear region. The fourth thin film transistor T4 is fully turned on. One end of the fourth thin film transistor T4 connected to the data signal line is the drain terminal (d), and the other end is the source terminal (s) and is electrically connected to one end of the light-emitting diode. In the small voltage range of Vds, the narrowing of the conduction channel of the thin film transistor is not obvious. $I_{ds}$ is proportional to $V_{ds}$, and the channel acts as a resistor.

Correspondingly, the current formula of the thin film transistor in the saturation region is:

$$I_{ds} = \mu C_{ox} \cdot \frac{W}{2L}(V_{gs} - V_{th})^2, \text{ where } Vds > Vgs - Vth.$$

During L-Aging, it is hoped that the entire surface can be aged with a uniform current, so that the in-plane OLED can be aged indiscriminately. This requires that the $I_{ds}$ current difference corresponding to the in-plane thin film transistor is as small as possible. According to the above current formula, it can be known that $I_{ds}$ and $V_{th}$ have a square relationship in the saturation region, and a linear relationship between $I_{ds}$ and $V_{th}$ in the linear region. Therefore, the LEDs are aged in a linear region, and the difference of the corresponding Ids is small, so that the LEDs can be aged relatively uniformly.

Figure 5:
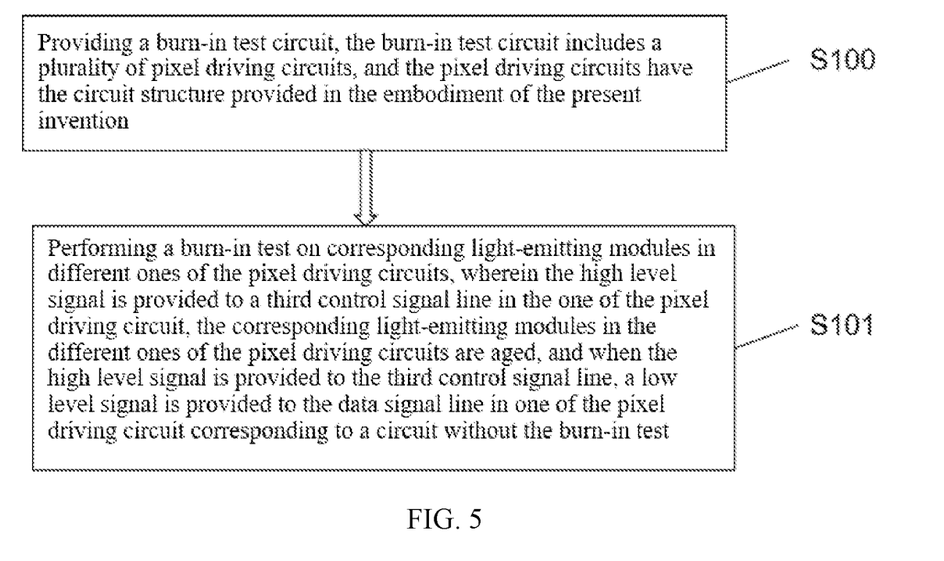
FIG. 5 is a schematic flowchart of a testing method provided in an embodiment of the present invention.

Preferably, an embodiment of the present invention further provides a burn-in method of a display panel. As shown in FIG. 5, FIG. 5 is a schematic flowchart of a testing method provided in an embodiment of the present invention. In the burn-in test of light-emitting diodes, the following steps are included:

S100: Providing a burn-in test circuit, the burn-in test circuit includes a plurality of pixel driving circuits, and the pixel driving circuits have the circuit structure provided in the embodiment of the present invention;

S101: Performing a burn-in test on corresponding light-emitting modules in different ones of the pixel driving circuits, wherein the high level signal is provided to a third control signal line in the one of the pixel driving circuit, the corresponding light-emitting modules in the different ones of the pixel driving circuits are aged, and when the high level signal is provided to the third control signal line, a low level signal is provided to the data signal line in one of the pixel driving circuit corresponding to a circuit without the burn-in test.

Figure 6:
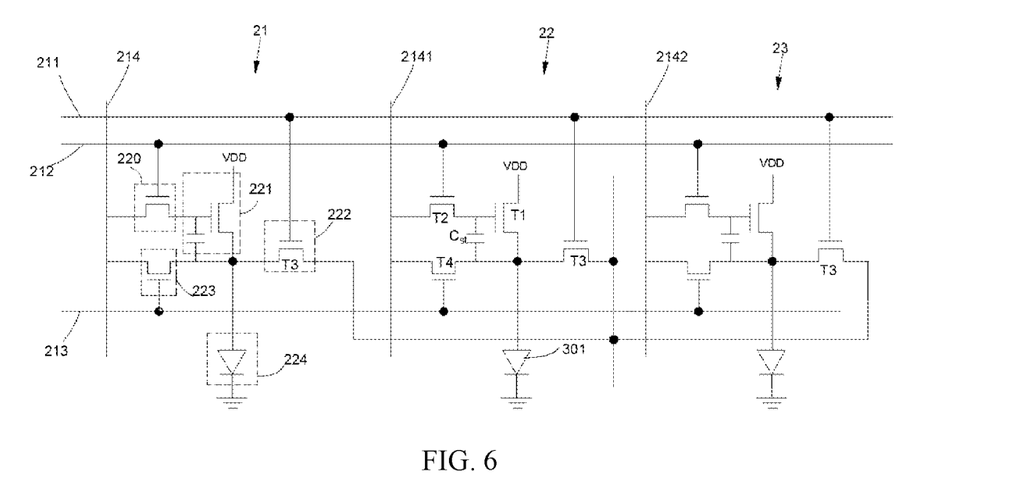
FIG. 6 is a circuit structure of a burn-in test in light-emitting pixel areas of different colors according to an embodiment of the present invention.

Further, as shown in FIG. 6, FIG. 6 is a circuit structure of a burn-in test provided in an embodiment of the present invention in light-emitting pixel areas of different colors. In the embodiment of the present invention, the burn-in test circuit is described by taking a first pixel driving circuit 21 corresponding to the red light-emitting pixel area, a second pixel driving circuit 22 corresponding to the green light-emitting pixel area, and a third pixel driving circuit 23 corresponding to the blue light-emitting pixel area as an example. A data signal line 214, a data signal line 2141, and a data signal line 2142 are correspondingly provided in each driving circuit. Different data signal lines provide different data signals.

Further, the sensing module in the first pixel driving circuit 21 is electrically connected to the sensing module in the third pixel driving circuit 23. Specifically, the drain of the third thin film transistor T3 in the first pixel driving circuit 21 is electrically connected to the drain of the third thin film transistor T3 in the second pixel driving circuit 22 and the drain of the third thin film transistor T3 in the third pixel driving circuit 23.

Combine FIG. 2 to FIG. 4, and the burn-in test method in FIG. 5. When aging the light-emitting diodes in the above-mentioned different pixel driving circuits, the third control signal line 213 provides a high level signal, and the data signal line 2141 and the data signal line 2142 provide a low level signal. The high potential of the third control signal line 213 also turns on the gate of the fourth thin film transistor T4 in the green and blue light-emitting pixel areas, because the data signal line 2141 and the data signal line 2142 provide low level signals, no current flows through the light-emitting diodes in the green and blue light-emitting pixel areas. In this way, only the light-emitting diodes in the red light-emitting pixel area are subjected to the burn-in treatment.

Similarly, when L-Aging needs to be performed on the green sub-pixel, the data signal line 214 and the data signal line 2142 are given a low potential, and the third control signal line 213 is given a high potential. Only the light-emitting diodes in the green light-emitting pixel areas emit light, while the light-emitting diodes in the red and blue light-emitting pixel areas do not emit light.

In the normal light-emitting stage, the third control signal line 213 is given a low level signal, and the fourth thin film transistor T4 is turned off. Therefore, it is ensured that the light-emitting diodes in the pixel driving circuit can be normally emit and can be properly aged under the condition of high current.

In particular, when aging, a DC signal is used. The DC signal does not have too high requirements on signal delay, so that the line width of the third control signal line 213 can be designed to be smaller than the line widths of the first control signal line 211 and the second control signal line 212. In this way, an area occupied by an opening area of the display panel can be further reduced, which is conducive to completing the aging without greatly damaging an opening ratio.

Therefore, when aging the display panel at a higher temperature and with a large current. The burn-in test circuit in the embodiment of the present invention can effectively reduce the electrical changes of the thin film transistors in different parts of the panel, and effectively reduce and improve the electrical drift of the thin film transistors during the burn-in process.

Embodiments of the present invention also provide a display device. The display device includes a display panel, and the display panel is provided with the pixel driving circuit provided in the embodiment of the present invention. The display panel and display device can be any product or component with display function, such as OLED panel, a mobile phone, a computer, an electronic paper, a display, a notebook computer, a digital photo frame, etc. Its specific type is not specifically limited.

A display panel and a burn-in test method of the display panel provided by the embodiments of the present invention are described above in detail. The principles and implementations of the present invention are described with specific examples herein. The descriptions of the above embodiments are only used to help understand the technical solutions and core ideas of the present invention. Those of ordinary skill in the art should understand that they can still make modifications to the technical solutions described in the foregoing embodiments or perform equivalent replacements to some of the technical features. However, these modifications or substitutions do not make the essence of the corresponding technical solutions deviate from the scope of the technical solutions of the embodiments of the present invention.

What is claimed is:

1. A display panel, comprising:
   a burn-in test circuit, wherein the burn-in test circuit comprises a plurality of pixel driving circuits, and one of the pixel driving circuits comprises:
   a data writing module, wherein the data writing module is electrically connected to a data signal line of the display panel and writes a data signal through the data signal line;
   a driving module, wherein the driving module is electrically connected to the data writing module, and the driving module is configured to receive the data signal of the data writing module and form a driving voltage according to the data signal;

a sensing module, wherein the sensing module is electrically connected to the driving module, and the sensing module is configured to sense the driving voltage and form a feedback current according to the driving voltage;

a control module, wherein the control module is electrically connected to the driving module and the sensing module; and a light-emitting module, wherein the light-emitting module is electrically connected to the driving module, the sensing module, and the control module;

wherein the control module is configured to receive a high level signal, so that the control module is fully turned on, and the control module is configured to perform a burn-in test on the light-emitting module according to the driving voltage and the feedback current, the driving module is provided with at least one thin film transistor and a capacitor, and the thin film transistor is electrically connected to the capacitor correspondingly.

2. The display panel of claim 1, wherein
the driving module comprises a first thin film transistor, a drain of the first thin film transistor is electrically connected to a voltage terminal, a gate of the first thin film transistor is electrically connected to the data writing module, and a source of the first thin film transistor is electrically connected to the light-emitting module, the sensing module, and the control module.

3. The display panel of claim 2, wherein
the driving module further comprises a capacitor, an end of the capacitor is electrically connected to the gate, and another end of the capacitor is electrically connected to the source.

4. The display panel of claim 1, wherein
the data writing module comprises a second thin film transistor, a drain of the second thin film transistor is electrically connected to the data signal line, and a source of the second thin film transistor is electrically connected to the driving module.

5. The display panel of claim 4, wherein
the pixel driving circuit further comprises a first control signal line, and the first control signal line is electrically connected to a gate of the second thin film transistor.

6. The display panel of claim 1, wherein
the sensing module comprises a third thin film transistor, and a source of the third thin film transistor is electrically connected to the driving module, the light-emitting module, and the control module.

7. The display panel of claim 6, wherein
the pixel driving circuit further comprises a second control signal line, and the second control signal line is electrically connected to a gate of the third thin film transistor.

8. A display panel, comprising
a burn-in test circuit, wherein the burn-in test circuit comprises a plurality of pixel driving circuits, and one of the pixel driving circuits comprises:
a data writing module, wherein the data writing module is electrically connected to a data signal line of the display panel and writes a data signal through the data signal line;
a driving module, wherein the driving module is electrically connected to the data writing module, and the driving module is configured to receive the data signal of the data writing module and form a driving voltage according to the data signal;
a sensing module, wherein the sensing module is electrically connected to the driving module, and the sensing module is configured to sense the driving voltage and form a feedback current according to the driving voltage;

a control module, wherein the control module is electrically connected to the driving module and the sensing module; and a light-emitting module, wherein the light-emitting module is electrically connected to the driving module, the sensing module, and the control module;

wherein the control module is configured to receive a high level signal, so that the control module is fully turned on, and the control module is configured to perform a burn-in test on the light-emitting module according to the driving voltage and the feedback current.

9. The display panel of claim 8, wherein
the driving module comprises a first thin film transistor, a drain of the first thin film transistor is electrically connected to a voltage terminal, a gate of the first thin film transistor is electrically connected to the data writing module, and a source of the first thin film transistor is electrically connected to the light-emitting module, the sensing module, and the control module.

10. The display panel of claim 9, wherein
the driving module further comprises a capacitor, an end of the capacitor is electrically connected to the gate, and another end of the capacitor is electrically connected to the source.

11. The display panel of claim 8, wherein
the data writing module comprises a second thin film transistor, a drain of the second thin film transistor is electrically connected to the data signal line, and a source of the second thin film transistor is electrically connected to the driving module.

12. The display panel of claim 11, wherein
the pixel driving circuit further comprises a first control signal line, and the first control signal line is electrically connected to a gate of the second thin film transistor.

13. The display panel of claim 8, wherein
the sensing module comprises a third thin film transistor, and a source of the third thin film transistor is electrically connected to the driving module, the light-emitting module, and the control module.

14. The display panel of claim 13, wherein
the pixel driving circuit further comprises a second control signal line, and the second control signal line is electrically connected to a gate of the third thin film transistor.

15. The display panel of claim 8, wherein
the control module comprises a fourth thin film transistor, a drain of the fourth thin film transistor is electrically connected to the data signal line, and a source of the fourth thin film transistor is electrically connected to the light-emitting module, the driving module, and the sensing module.

16. The display panel of claim 15, wherein
the pixel driving circuit further comprises a third control signal line, and a gate of the fourth thin film transistor is electrically connected to the third control signal line.

17. The display panel of claim 16, wherein
the third control signal line is configured to provide the high level signal to the gate of the fourth thin film transistor.

18. The display panel of claim 8, wherein
the pixel driving circuit comprises a first pixel driving circuit, a second pixel driving circuit, and a third pixel driving circuit, the first pixel driving circuit, the second pixel driving circuit, and the third pixel driving circuit are correspondingly arranged in light-emitting pixel areas of different colors, and the sensing module in the first pixel driving circuit is electrically connected to the sensing module in the second pixel driving circuit and the sensing module in the third pixel driving circuit.

19. The display panel of claim 18, wherein
drains of corresponding third thin film transistors in each pixel driving circuit are electrically connected to each other.

20. A burn-in test method of a display panel, comprising following steps:
providing a burn-in test circuit, wherein the burn-in test circuit comprises a plurality of pixel driving circuits, and one of the pixel driving circuits comprises: a data writing module, wherein the data writing module is electrically connected to a data signal line of the display panel and writes a data signal through the data signal line; a driving module, wherein the driving module is electrically connected to the data writing module, and the driving module is configured to receive the data signal of the data writing module and form a driving voltage according to the data signal; a sensing module, wherein the sensing module is electrically connected to the driving module, and the sensing module is configured to sense the driving voltage and form a feedback current according to the driving voltage; a control module, wherein the control module is electrically connected to the driving module and the sensing module; and a light-emitting module, wherein the light-emitting module is electrically connected to the driving module, the sensing module, and the control module; wherein the control module is configured to receive a high level signal, so that the control module is fully turned on, and the control module is configured to perform a burn-in test on the light-emitting module according to the driving voltage and the feedback current;

performing a burn-in test on corresponding light-emitting modules in different ones of the pixel driving circuits, wherein the high level signal is provided to a third control signal line in the one of the pixel driving circuit, the corresponding light-emitting modules in the different ones of the pixel driving circuits are aged, and when the high level signal is provided to the third control signal line, a low level signal is provided to the data signal line in one of the pixel driving circuit corresponding to a circuit without the burn-in test.

* * * * *